United States Patent
Choi et al.

(10) Patent No.: US 8,996,964 B2
(45) Date of Patent: Mar. 31, 2015

(54) NONVOLATILE MEMORY DEVICE AND RELATED READ METHOD USING HARD AND SOFT DECISION DECODING

(71) Applicant: Samsung Electronics Co., Ltd., Suwon-Si, Gyeonggi-Do (KR)

(72) Inventors: Seonghyeog Choi, Hwaseong-Si (KR); Junjin Kong, Yongin-Si (KR); Hong Rak Son, Anyang-Si (KR); Pilsang Yoon, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 99 days.

(21) Appl. No.: 13/786,509

(22) Filed: Mar. 6, 2013

(65) Prior Publication Data

US 2013/0326314 A1  Dec. 5, 2013

(30) Foreign Application Priority Data

Jun. 4, 2012 (KR) .................... 10-2012-0059957

(51) Int. Cl.
*H03M 13/00* (2006.01)
*H03M 13/37* (2006.01)
*H03M 13/45* (2006.01)

(52) U.S. Cl.
CPC ...... *H03M 13/3784* (2013.01); *H03M 13/3707* (2013.01); *H03M 13/45* (2013.01)
USPC .......................................... 714/780

(58) Field of Classification Search
CPC .... G11C 11/5642; G11C 16/06; G11C 16/10; G11C 16/26; G11C 16/349; G11C 29/00; G11C 11/5628; G11C 16/08; G06F 11/1072; G06F 11/1012
USPC .................. 714/780, 704, E11.005, E11.021, 714/E11.034, 2, 42, 48, 6.1, 718, 722, 758, 714/773, 799; 365/185.03, 185.09, 185.11, 365/185.33, 200, 201
See application file for complete search history.

(56) References Cited

U.S. PATENT DOCUMENTS

| | | | |
|---|---|---|---|
| 7,656,707 B2 | 2/2010 | Kozlov | |
| 7,966,546 B2 | 6/2011 | Mokhlesi et al. | |
| 2009/0177931 A1* | 7/2009 | Song et al. | 714/704 |
| 2010/0192042 A1 | 7/2010 | Sharon et al. | |
| 2010/0223538 A1 | 9/2010 | Sakurada | |
| 2011/0131473 A1 | 6/2011 | Mokhlesi et al. | |
| 2011/0145487 A1 | 6/2011 | Haratsch et al. | |
| 2011/0167305 A1 | 7/2011 | Haratsch et al. | |
| 2011/0231738 A1* | 9/2011 | Horisaki | 714/773 |
| 2013/0077400 A1* | 3/2013 | Sakurada | 365/185.03 |

* cited by examiner

*Primary Examiner* — Guy Lamarre
(74) *Attorney, Agent, or Firm* — Volentine & Whitt, PLLC

(57) ABSTRACT

A storage device comprises a nonvolatile memory device comprising a plurality of memory cells, and an error correction circuit configured to receive primary data and secondary data from the nonvolatile memory device and to perform a hard decision decoding operation on the primary data and further configured to perform a soft decision decoding operation on the primary data based on the secondary data. The primary data is read from the plurality of memory cells in a hard decision read operation and the secondary data is read from memory cells programmed to a specific state from among the primary data.

20 Claims, 13 Drawing Sheets

| Read Data | Number of 1s | MSB | Reliability Bit |
|---|---|---|---|
| 111111 | 110 | 1 | 11 |
| 011111 | 101 | 1 | 10 |
| 001111 | 100 | 0 | 01 |
| 000111 | 011 | 0 | 11 |
| 000011 | 010 | 0 | 01 |
| 000001 | 001 | 1 | 10 |
| 000000 | 000 | 1 | 11 |

| MSB | 10110011 |
|---|---|
| Secondary Data 1 | 10010000 |
| Secondary Data 2 | 11011100 |

NONVOLATILE MEMORY DEVICE AND RELATED READ METHOD USING HARD AND SOFT DECISION DECODING

CROSS-REFERENCE TO RELATED APPLICATIONS

This application claims priority under 35 U.S.C. §119 to Korean Patent Application No. 10-2012-0059957 filed Jun. 4, 2012, the subject matter of which is hereby incorporated by reference.

BACKGROUND OF THE INVENTION

The inventive concept relates generally to electronic memory technologies. More particularly, certain embodiments of the inventive concept relate to nonvolatile memory devices and related methods of operation.

Semiconductor memory devices can be roughly divided into two categories according to whether they retain stored data when disconnected from power. These categories include volatile memory devices, which lose stored data when disconnected from power, and nonvolatile memory devices, which retain stored data when disconnected from power. Examples of volatile memory devices include dynamic random access memory (DRAM) and static random access memory (SRAM). Examples of nonvolatile memory devices include electrically programmable erasable read only memory (EEPROM), mask read-only memory (MROM), and programmable ROM (PROM).

Flash memory is a type of EEPROM that is currently used in many applications for long term data storage. For example, flash memory devices are commonly used to store voice and image data in electronic devices such as computers, mobile phones, personal digital assistants (PDAs), digital cameras, camcorders, voice recorders, MP3 players, handheld personal computers (PCs), gaming machines, facsimile machines, scanners, and printers.

In recent years, there has been a general demand to increase the amount of data storage provided by flash memory devices and other forms of nonvolatile memory. One approach that has been adopted for this purpose is to design flash memory cells capable of storing more than one bit of data. A flash memory cell designed to store one bit of data is generally referred to as a single level cell (SLC), and a flash memory cell designed to store more than one bit of data is generally referred to as a multi-level cell (MLC).

As the number of bits stored in each memory cell increases, stored data may become less reliable because a greater level of operational precision is required to store more bits per cell. Accordingly, researchers are engaged in continuing efforts to improve the reliability and other performance characteristics of MLCs. One area of active research involves the development of improved error detection and correction techniques to address data storage or access errors when they occur.

SUMMARY OF THE INVENTION

In one embodiment of the inventive concept, a storage device comprises a nonvolatile memory device comprising a plurality of memory cells, and an error correction circuit configured to receive primary data and secondary data from the nonvolatile memory device and to perform a hard decision decoding operation on the primary data and further configured to perform a soft decision decoding operation on the primary data based on the secondary data. The primary data is read from the plurality of memory cells in a hard decision read operation and the secondary data is read from memory cells programmed to a specific state from among the primary data.

In another embodiment of the inventive concept, a method of processing data read from a nonvolatile memory device comprises receiving primary data from the nonvolatile memory device, performing a hard decision decoding operation on the primary data, receiving secondary data from the nonvolatile memory device, and performing a soft decision decoding operation on the primary data based on the secondary data. The primary data is data read from the plurality of memory cells in a hard decision read operation and the secondary data is read from memory cells programmed to a specific state among the primary data.

In another embodiment of the inventive concept, a method of reading a nonvolatile memory device comprises reading primary data from a plurality of multi level cells in the nonvolatile memory device, performing a hard decision decoding operation on the primary data, determining whether the hard decision decoding operation has failed, upon determining that the hard decision decoding operation has failed, reading secondary data from the nonvolatile memory device, and performing a soft decision decoding operation based on the primary data and the secondary data.

These and other embodiments of the inventive concept can potentially improve the reliability of nonvolatile memory devices by providing enhanced error correction capability.

BRIEF DESCRIPTION OF THE DRAWINGS

The drawings illustrate selected embodiments of the inventive concept. In the drawings, like reference numbers indicate like features. In addition, the relative dimensions of various features may be exaggerated for illustration purposes.

DETAILED DESCRIPTION

Figure 1:
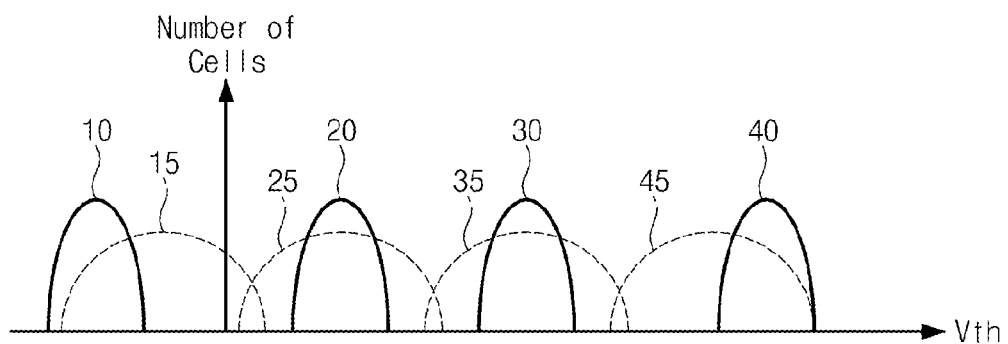
FIG. 1 is a diagram illustrating threshold voltage distributions of a multi-bit nonvolatile memory device including errors.

Embodiments of the inventive concept are described below with reference to the accompanying drawings. These embodiments are presented as teaching examples and should not be construed to limit the scope of the inventive concept.

In the description that follows, the terms "first", "second", "third", etc., may be used to describe various features, but the described features should not be limited by these terms. Rather, these terms are used merely to distinguish between different features. Thus, a first feature discussed below could be termed a second feature, and vice versa, without changing the meaning of the relevant description.

Spatially relative terms, such as "beneath", "below", "lower", "under", "above", "upper" and the like, may be used herein for ease of description to describe relationships between different features as illustrated in the figures. The spatially relative terms are intended to encompass different orientations of the device in use or operation in addition to the orientation depicted in the figures. For example, if the device in the figures is turned over, features described as "below" or "beneath" or "under" other features would then be oriented "above" the other features. Thus, the terms "below" and "under" can encompass both an orientation of above and below, for example. The device may be otherwise oriented (e.g., rotated 90 degrees or at other orientations), with spatially relative descriptors interpreted accordingly. In addition, where a feature is referred to as being "between" two features, it can be the only feature between the two features, or one or more intervening features may also be present.

The terminology used herein is for the purpose of describing particular embodiments only and is not intended to be limiting of the inventive concept. As used herein, the singular forms "a", "an" and "the" are intended to encompass the plural forms as well, unless the context clearly indicates otherwise. The terms "comprises" and/or "comprising," where used in this specification, indicate the presence of stated features but do not preclude the presence or addition of one or more other features. As used herein, the term "and/or" includes any and all combinations of one or more of the associated listed items.

Where a feature is referred to as being "on", "connected to", "coupled to", or "adjacent to" another feature, it can be directly on, connected, coupled, or adjacent to the other feature, or intervening features may be present. In contrast, where a feature is referred to as being "directly on," "directly connected to", "directly coupled to", or "immediately adjacent to" another feature, there are no intervening features present.

Unless otherwise defined, all terms (including technical and scientific terms) used herein have the same meaning as commonly understood by one of ordinary skill in the art. Terms such as those defined in commonly used dictionaries should be interpreted as having a meaning that is consistent with their meaning in the context of the relevant art and/or the present specification and will not be interpreted in an idealized or overly formal sense unless expressly so defined herein.

FIG. 1 is a diagram illustrating threshold voltage distributions of a multi-bit nonvolatile memory device including errors. In this example, the nonvolatile memory device is a 2-bit nonvolatile memory device. In each of the drawings showing threshold voltage distributions, a horizontal axis represents threshold voltage and a vertical axis represents the number of memory cells.

Referring to FIG. 1, memory cells in the nonvolatile memory device are designed to be programmed to reference distributions 10, 20, 30, and 40. These reference distributions, which correspond to threshold voltages of memory cells, may vary due to various factors, which can cause read errors.

One factor that can produce variations of threshold voltages is interference between adjacent memory cells. Such interference may include, for instance, F-poly coupling, lateral charge spreading, and so on. This interference may be relatively pronounced between memory cells programmed to an erase state E0 and memory cells programmed to the uppermost program state P3. Another factor that can produce variations of threshold voltages is read disturbance, which tends to occur in memory cells programmed to erase state E0. Yet another factor is that the amount of charge of a memory cell may decrease over time. This phenomenon commonly happens in memory cells programmed to uppermost program state P3. In addition to the above factors, a threshold voltage of a memory cell may vary due to other causes. For example, a threshold voltage may vary due to process defects, distortion due to instability of a channel, program disturbance, and so on.

Upon initial programming, threshold voltages of the programmed memory cells may conform to reference distributions 10 to 40. Thereafter, however, reference distribution 10 may be shifted into a distribution 15 due to one or more of the above-described factors. Similarly, reference distribution 40 may be shifted into a distribution 45. For example, threshold voltages of memory cells in erase state E0 may increase, and threshold voltages of memory cells in uppermost program state P3 may decrease due to the lateral charge spreading.

As will be described below, certain embodiments of the inventive concept are designed to improve the reliability of read operations for memory cells having shifted or otherwise non-ideal threshold voltage distributions, such as those illustrated in FIG. 1. In particular, some embodiments are designed to improve the reliability of memory cells programmed to an erase state E0 (hereinafter, "erase state cells") and memory cells programmed to an uppermost program state such as program state P3 (hereinafter, "uppermost state cells").

Figure 2:
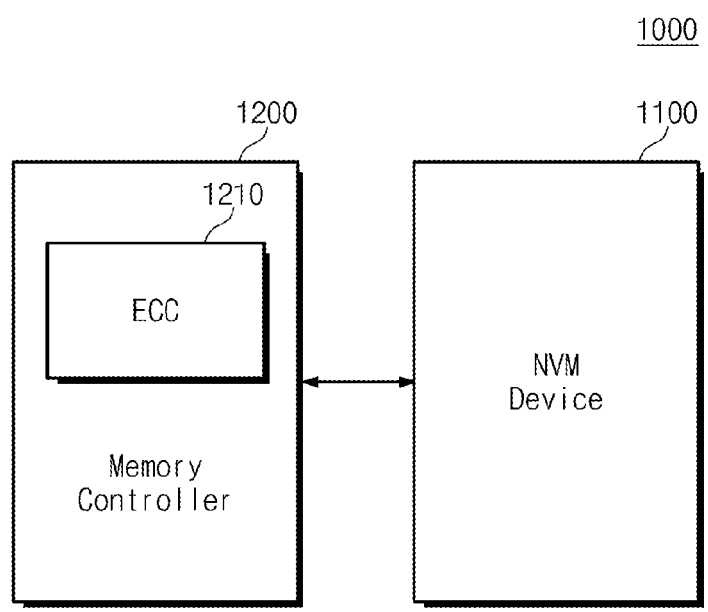
FIG. 2 is a block diagram illustrating a memory system according to an embodiment of the inventive concept.

FIG. 2 is a block diagram illustrating a memory system 1000 according to an embodiment of the inventive concept.

Referring to FIG. 2, a memory system 1000 comprises a nonvolatile memory device 1100 and a memory controller 1200. In a read operation, memory system 1000 corrects an error due to a variation in threshold voltages of memory cells. For example, memory system 1000 may correct an error due to a variation in a threshold voltage of an erase state cell or an uppermost state cell. The correction of such errors can improve the reliability of read data.

Nonvolatile memory device 1100 may be a flash memory device, for example. Under the control of memory controller 1200, nonvolatile memory device 1100 may read data or program data provided from memory controller 1200 to a memory cell array.

Memory controller 1200 comprises an error correction circuit 1210 to correct errors in data read from nonvolatile memory device 1100. Error correction circuit 1210 uses both hard decision decoding operations and soft decision decoding operations to correct the errors.

Data of a memory cell is read according to an on/off state of the memory cell to which a predetermined reference voltage is applied. The read data may be referred to as hard decision data. Then, in a hard decision decoding operation, an error correction code is used to detect and/or correct any error in the read data. If the hard decision decoding operation is unable to detect and/or correct errors in the read data, a soft decision decoding operation may be performed. In the soft decision decoding operation, additional information regarding the reliability of the hard decision data is used as a further aid for detecting and/or correcting errors. Stated another way, where an error correction operation using the hard decision decoding operation fails, error correction circuit 1210 may again perform an error correction operation using the soft decision decoding operation. Alternatively, error correction circuit 1210 may again perform an error correction operation using the hard decision decoding operation without performing an error correction operation using the hard decision decoding operation.

Figure 3:
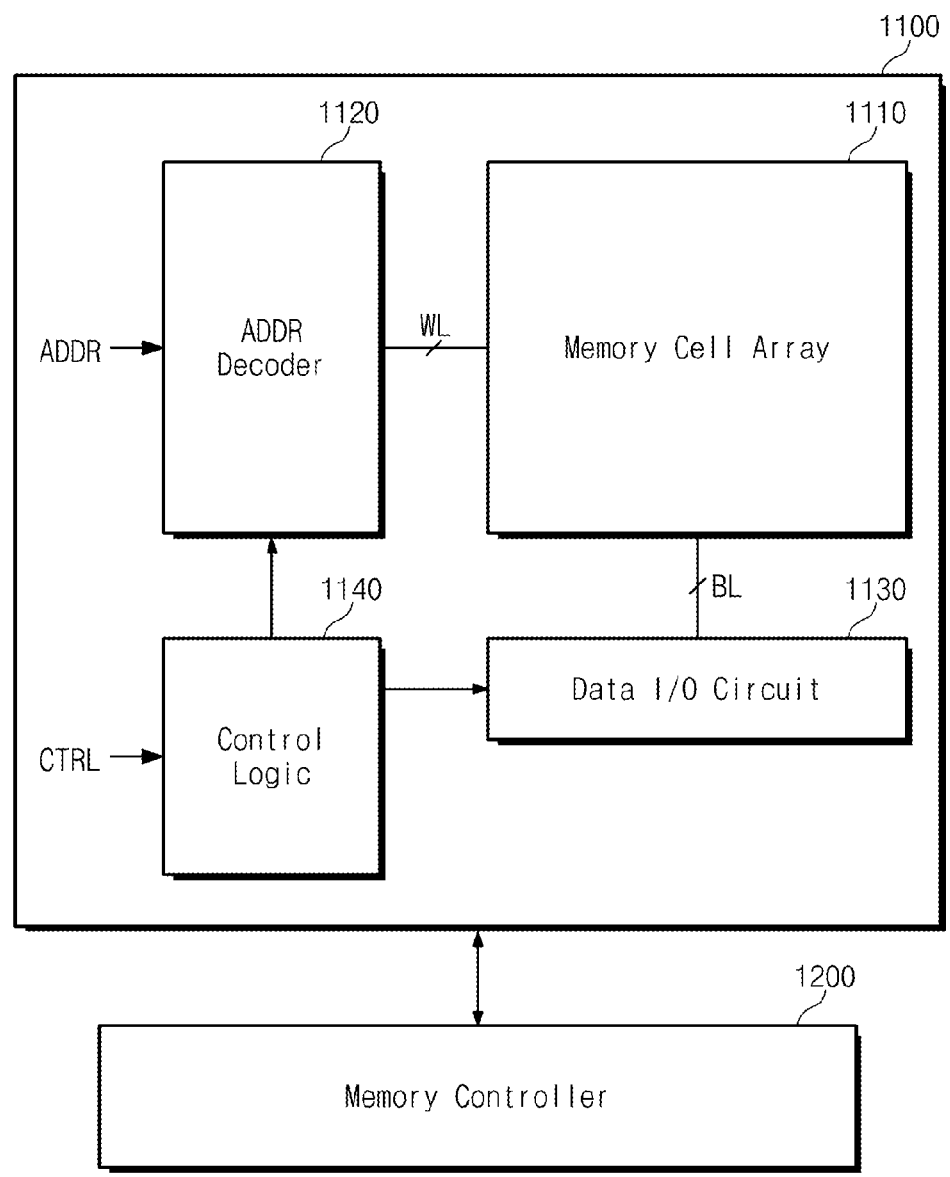
FIG. 3 is a block diagram illustrating a nonvolatile memory device in the memory system of FIG. 2.

FIG. 3 is a block diagram illustrating an example of nonvolatile memory device 1100 of FIG. 2.

Referring to FIG. 2, nonvolatile memory device 1100 comprises a memory cell array 1110, an address decoder 1120, a data input/output circuit 1130, and control logic 1140.

Memory cell array 1110 is connected with address decoder 1120 via word lines WL. Memory cell array 1110 is connected with data input/output circuit 1130 via bit lines BL. Memory cell array 1110 comprises a plurality of cell strings each having a channel formed in a vertical or horizontal direction. Memory cell array 1110 further comprises a plurality of word lines stacked in a vertical direction. For example, memory cell array 1110 may be configured to store one or more bits per memory cell.

Address decoder 1120 is connected with memory cell array 1110 via word lines WL. Address decoder 1120 operates responsive to the control of control logic 1140, and it receives an address ADDR from an external device. Address decoder 1120 decodes a block address of the input address ADDR and activates one or more memory blocks using the decoded block address. Address decoder 1120 decodes a row address of the input address ADDR and selects word lines WL using the decoded row address.

Data input/output circuit 1130 is connected with memory cell array 1110 via bit lines BL. Data input/output circuit 1130 acts as a write driver or a sense amplifier under the control of control logic 1140. For example, data input/output circuit 1130 may act as the sense amplifier in a read mode and as the write driver in a program mode.

Data input/output circuit 1130 receives data from memory controller 1200. In a program operation, data input/output circuit 1130 programs input data in a selected page. In a read operation, data input/output circuit 1130 reads data of a selected page and outputs it to memory controller 1200. In the read operation, data input/output circuit 1130 may read additional information on an erase state cell or an uppermost state cell to assist in soft decision decoding operations. Example of the use of this additional information will be fully described with reference to FIGS. 6 to 10.

Data read through data input/output circuit 1130 is output to the external device by a page unit. Alternatively, data read through data input/output circuit 1130 may be output to the external device by a packet unit, where the packet comprises a plurality of pages.

Control logic 1140 is connected with address decoder 1120 and data input/output circuit 1130. Control logic 1140 controls address decoder 1120 and data input/output circuit 1130 according to a control signal CTRL received from the external device.

Nonvolatile memory device 1100 is configured to read additional information on an erase state cell in the read operation. Alternatively, in the read operation, nonvolatile memory device 1100 may be configured to read additional information on an uppermost state cell. In an error correction operation of memory controller 1200, nonvolatile memory device 1100 may provide memory controller 1200 with additional information on the erase state cell or the uppermost state cell.

Figure 4:
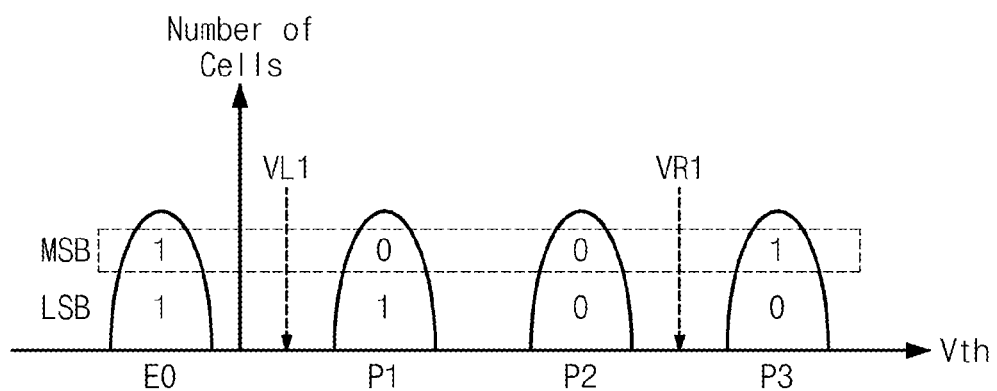
FIG. 4 is a diagram illustrating reference threshold voltage distributions of memory cells.
Figure 5:
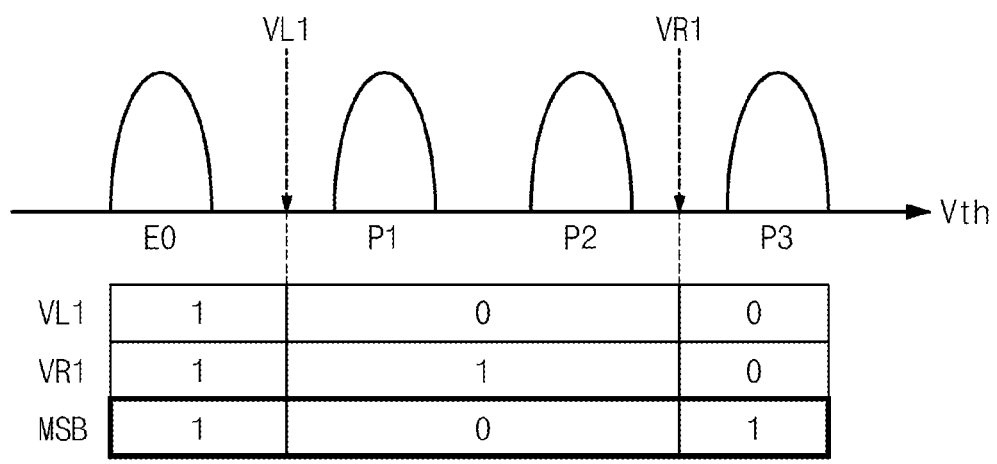
FIG. 5 is a diagram illustrating a hard decision read operation of an MSB value programmed in a memory cell.
Figure 6:
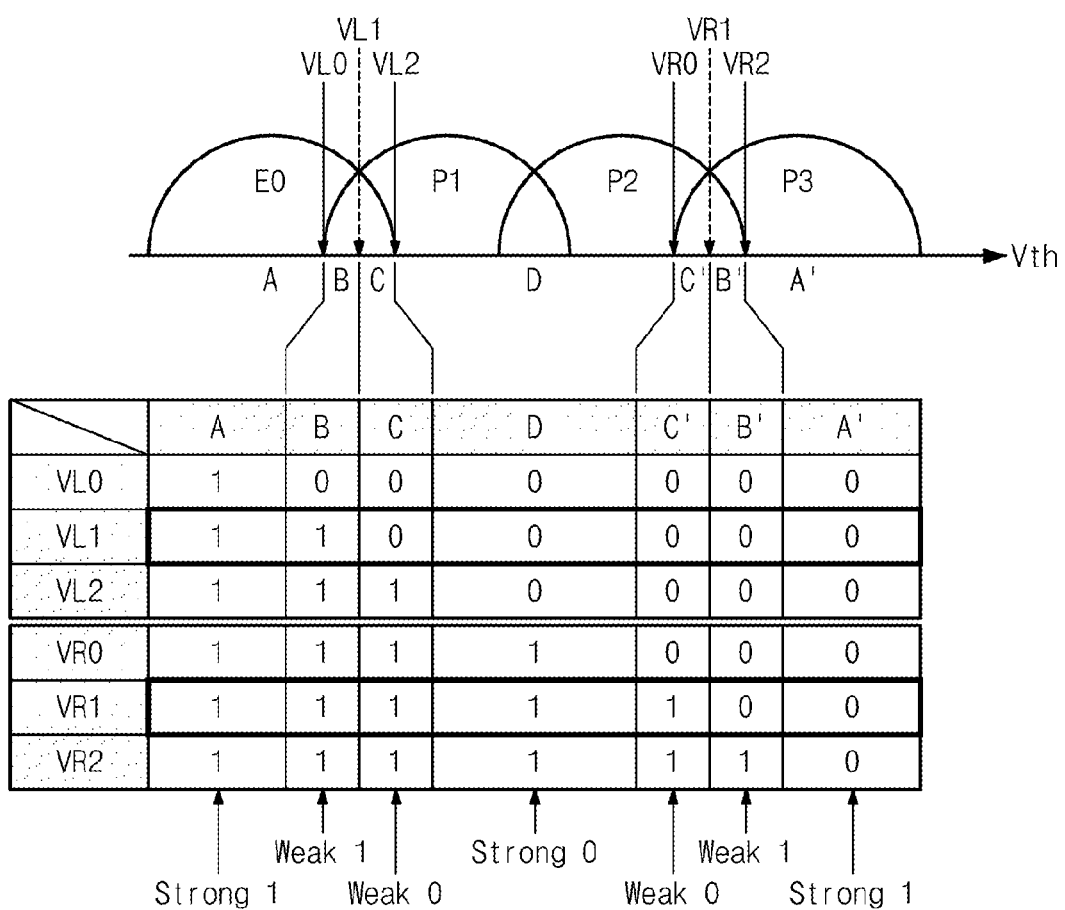
FIG. 6 is a diagram illustrating a soft decision read operation of an MSB value programmed in a memory cell having an abnormal state.

FIGS. 4 through 6 are diagrams illustrating hard and soft decision read operations of a memory system according to certain embodiments of the inventive concept. In the examples of FIGS. 4 through 6, the memory cells are 2-bit memory cells. However, the inventive concept is not limited to 2-bit memory cells. For example, in alternative embodiments, the inventive concept may be applied to multi-bit memory cells storing three or more data bits.

FIG. 4 is a diagram illustrating reference threshold voltage distributions of memory cells.

Referring to FIG. 4, a threshold voltage of a memory cell in which 2-bit data is programmed may correspond to one of four data states E0, P1, P2, and P3. Each data state has a threshold voltage window.

A plurality of data bits stored in one memory cell may be programmed independently through a plurality of program operations. For example, in a multi-bit cell storing 2-bit data, a first data bit (or least significant bit (LSB)) may be programmed, and then a second bit (or most significant bit (MSB)) may be programmed thereafter.

Where a hard decision read operation is performed, two read voltages VL1 and VR1 are used to read MSB programmed in a memory cell. Below, it are assumed that memory cells having threshold voltages lower than a read voltage store a data bit of '1' and that memory cells having threshold voltages higher than the read voltage store a data bit of '0'. However, the inventive concept is not limited thereto.

FIG. 5 is a diagram illustrating a hard decision read operation of an MSB value programmed on a memory cell.

Referring to FIG. 5, logical values may be read from each memory cell according to a first left read voltage VL1 and a first right read voltage VR1. Data '1' is read from a memory cell having an erase state E0 where first left and right read voltages VL1 and VR1 are applied to the memory cell, respectively. Data '0' is read from a memory cell having a first program state P1 or a second program state P2 where first left read voltage VL1 is applied to the memory cell, and data '1' is read from the memory cell having first program state P1 or second program state P2 where first right read voltage VR1 is applied to the memory cell. Data '0' is read from a memory cell having an uppermost program state P3 where first left and right read voltages VL1 and VR1 are applied to the memory cell, respectively.

In the hard decision read operation, MSB programmed in a memory cell is determined by performing an XNOR operation on data values read according to the first left and right read voltages VL1 and VR1.

Voltage levels of first left and right read voltages VL1 and VR1 used in the hard decision read operation are determined according to reference threshold voltage distributions illustrated in FIGS. 4 and 5. An error may occur where the hard decision read operation reads one or more abnormal states, and a memory system according to certain embodiments performs a soft decision read operation where an error correction operation of data read in the hard decision read operation is failed.

FIG. 6 is a diagram illustrating a soft decision read operation of an MSB value programmed in a memory cell having an abnormal state.

Referring to FIG. 6, memory cells are read using left read voltages VL0 to VL2 and right read voltages VR0 to VR2. A table shows logical values of memory cells in groups A, B, C, D, C', B', and A' classified according to threshold voltages, and the logical values of the memory cells may be determined using read voltages VL0 to VL2 and VR0 to VR2.

Based on the read operations, a data symbol is determined for each memory cell. The data symbol is data indicating whether a memory cell belongs to any one of groups A, B, C, D, C', B', and A' according to its threshold voltage. The data symbol may be generated from sequential data of logical values corresponding to read voltages VL0 to VL2 and VR0 to VR2. For example, sequential data of logical values corresponding to read voltages VL0 to VL2 and VR0 to VR2 may be used directly as a data symbol.

For example, a data value '1' may be read from memory cells in group A having threshold voltages lower than left read voltage VL0 when each of read voltages VL0 to VL2 and VR0 to VR2 is applied to the memory cells in group A. A data symbol read from the memory cells in group A may be [111111].

A data value '0' may be read from memory cells in group B having threshold voltages higher than left read voltage VL0 and lower than left read voltage VL1 when left read voltage VL0 is applied to the memory cells in group B. A data value '1' may be read from memory cells in group B where each of the remaining read voltages is applied to the memory cells in group B. A data symbol read from the memory cells in group A may be [011111].

The reliability of an MSB value read in a hard decision read operation may be determined according to the data symbol. For instance, the probability that MSB values programmed at memory cells in groups A and A' are logical high values '1' may be high. Although MSB values programmed at memory cells in group B and B' are read to be a logical high value '1', their reliability may be low.

Where a read operation is performed using a soft decision decoding operation, a memory system may divide memory cells into a plurality of groups on the basis of threshold voltages, and may correct MSB values under the condition that corresponding reliability levels are applied to the groups, respectively. An error correction capacity of the soft decision read operation may be higher than that of a hard decision read operation.

Although the description of FIG. 6 assumes that a data symbol comprises sequential data of logical values corresponding to read voltages VL0 to VL2 and VR0 to VR2, the inventive concept is not limited thereto. For example, another type of data symbol is described below with reference to FIG. 7.

Figures 7, 8:
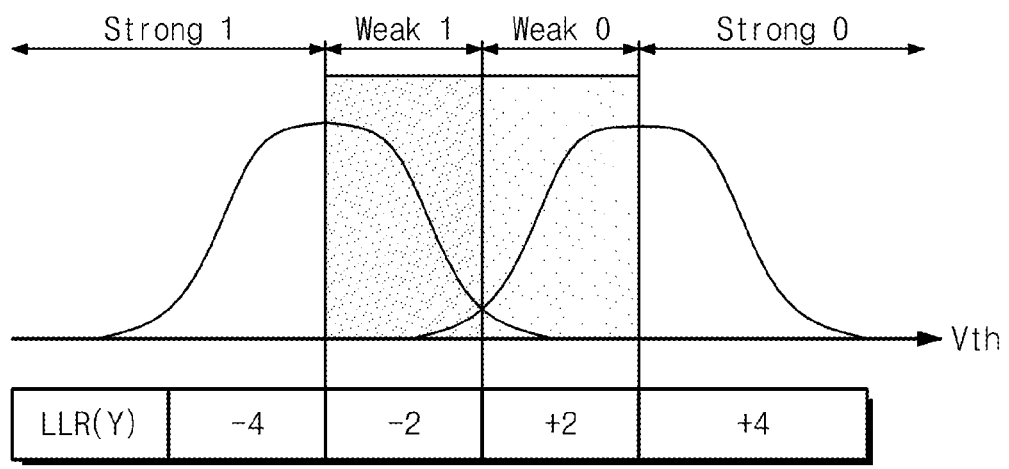
FIG. 7 is a diagram illustrating a conversion table used to generate a data symbol.
FIG. 8 is a diagram illustrating an example where reliability data corresponding to a group of memory cells is used to read MSB data.

FIG. 7 is a diagram illustrating a conversion table used to generate a data symbol.

Referring to FIG. 7, a data symbol may be generated variously using sequential data (hereinafter, referred to as read data) of logical values on read voltages VL0 to VL2 and VR0 to VR2. For example, a data symbol may be expressed by the number of data bits '1' in read data. Where read data read from memory cells in a group A is [111111], a data symbol may be [110]. Where read data read from memory cells in a group B is [011111], a data symbol may be [101].

In some embodiments as described above, a data symbol is generated using six read voltages. However, a data symbol may be generated using more read voltages. As the number of read voltages and the number of groups increase, computation for a soft decision operation may increase. In certain other embodiments, the same reliability level may be applied to similar groups. In this case, because the reliability is not calculated with respect to all groups, computation and an information transfer amount may decrease.

For example, Referring to FIG. 6, MSB values read at soft decision read operations on groups A and A', B and B', and C and C' and the reliability on the MSB values may be similar to one another. A data symbol may be generated by combination of MSB values read at soft decision read operations and reliability bits indicating the reliability. Because the data symbol has the same value with respect to similar groups, computation and an information transfer amount may decrease.

A conversion table associated with the above description is illustrated in FIG. 7. As illustrated in FIG. 7, a data symbol read from memory cells in group A and a data symbol read from memory cells in group A' may be [111], that is, equal to each other. In example embodiments, the higher the reliability, the larger a reliability bit value.

FIG. 8 is a diagram illustrating an example where reliability data corresponding to a group of memory cells is used to read MSB data.

Referring to FIG. 8, a table indicates a log likelihood ratio (LLR) for groups of memory cells divided on the basis of threshold voltages. The LLR is a value obtained by normalizing a logarithm value of a likelihood ratio.

The likelihood ratio is calculated according to a ratio of a first probability to a second probability. For example, the first probability may indicate the probability that a data bit programmed at a program operation of a memory cell corresponding to a predetermined data symbol is '1', and the second probability may indicate the probability that a data bit programmed at a program operation of a memory cell corresponding to a predetermined data symbol is '0'. The likelihood ratio may be calculated by the following equation (1).

$$LR(Y) = \frac{P(Y \mid S = 0)}{P(Y \mid S = 1)} \quad (1)$$

The LLR may be expressed by the following equation (2).

$$LLR(Y) = C \log \frac{P(Y \mid S = 0)}{P(Y \mid S = 1)} \quad (2)$$

In equations (1) and (2), 'Y' represents data read from a memory cell, 'S' represents a data bit programmed in a program operation. 'C' is a normalization constant. As the probability that a data bit programmed at a memory cell is '0' becomes high, the LLR may have a larger positive value. Where the probability that a data bit programmed in a memory cell is '1' is high, the LLR may have a relatively large negative value. Where the probability that a data bit programmed in a memory cell becomes unspecific is high, the LLR may have a value approximate to '0'.

As indicated above, a memory system may perform an error correction operation under the condition that MSB read in a hard decision read operation is substituted by an LLR value corresponding to a data symbol as a weight. LLR values associated with groups may be stored in a table. As described with reference to FIG. 7, the same data symbol may correspond to a plurality of groups. An LLR value corresponding to a predetermined data symbol may be an average of LLR values on a group corresponding to a data symbol.

As described above, however, threshold voltage distributions of erase state cells and uppermost state cells may deviate from a reference state compared with threshold voltage distributions of other program state cells. As described in further detail below, a memory system may separate the reliability of erase and uppermost state cells from that of other program state cells to perform an error correction operation with greater precision.

Figures 9, 10:
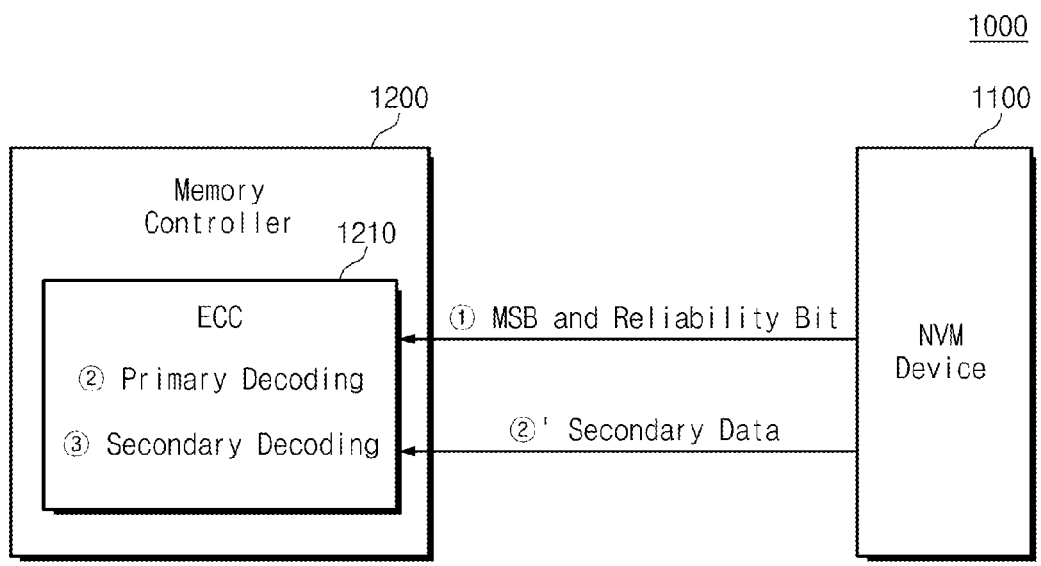
FIG. 9 is a diagram illustrating a method of reading MSB data using a soft decision decoding operation according to an embodiment of the inventive concept.
FIG. 10 is a table illustrating secondary data used in a soft decision decoding operation according to an embodiment of the inventive concept.

FIG. 9 is a diagram illustrating a method of reading MSB data using a soft decision decoding operation according to an embodiment of the inventive concept. The method of FIG. 9 will be described with reference to memory system 1000 of FIG. 2. In the example of FIG. 9, memory system 1000 corrects an error due to a variation in threshold voltages of memory cells in a read operation. For example, memory system 1000 may correct an error due to a variation in threshold voltages of memory cells having an erase cell state or uppermost cell state.

Referring to FIG. 9, nonvolatile memory device 1100 provides error correction circuit 1210 with an MSB bit read at a hard decision read operation and a reliability bit. Error correction circuit 1210 performs a primary decoding operation under the condition that the MSB bit read in a hard decision read operation is substituted by an LLR value corresponding to the reliability bit as a weight.

During a primary decoding operation of error correction circuit 1210, nonvolatile memory device 1100 provides secondary data to error correction circuit 1210. The secondary data comprises data bits read from erase state cells from among first transferred MSBs. Alternatively, the secondary data may be formed of data bits read from uppermost state cells among the first transferred MSBs.

Where a primary soft decision decoding operation is failed, error correction circuit 1210 performs a secondary soft decision decoding operation using the secondary data. In the secondary decoding operation, error correction circuit 1210 revises the reliability of a data bit read from an erase state cell or an uppermost state cell using the secondary data.

FIG. 10 is a table illustrating secondary data according to an embodiment of the inventive concept. More specifically, the table of FIG. 10 shows an MSB bit page and a secondary data page read from eight memory cells. It is assumed that MSB bits read from memory cells at a hard decision read operation are [10110011]. As described with reference to FIG. 5, in a hard decision read operation, MSB data is calculated through an exclusive NOR operation on data read using a left read voltage VL1 and data read using a right read voltage VR1.

In some embodiments, secondary data may be data read using left read voltage VL1 (hereinafter, "first secondary data"). Alternatively, secondary data may be data read using right read voltage VR1 (hereinafter, "second secondary data").

In the first secondary data, a bit having a logical value of '1' is a bit, read from an erase state cell, among MSBs each having a logical value of '1'. In the second secondary data, a bit having a logical value of '0' is a bit, read from an erase state cell, among MSBs each having a logical value of '1'.

Error correction circuit 1210 revises the reliability of a bit, read from an erase state cell or an uppermost state cell, among MSBs using secondary data. In this context, the secondary data is data used to calculate MSB bits. Thus, where MSB bits and reliability bits are read in a hard decision read operation, secondary data is also previously read.

As described above, in a multi-bit cell storing 2-bit data, an MSB is calculated by performing an exclusive NOR operation on first secondary data and second secondary data. Because MSB is previously stored, additional secondary data may be calculated using the MSB when one of the first and second secondary data is transferred.

Figure 11:
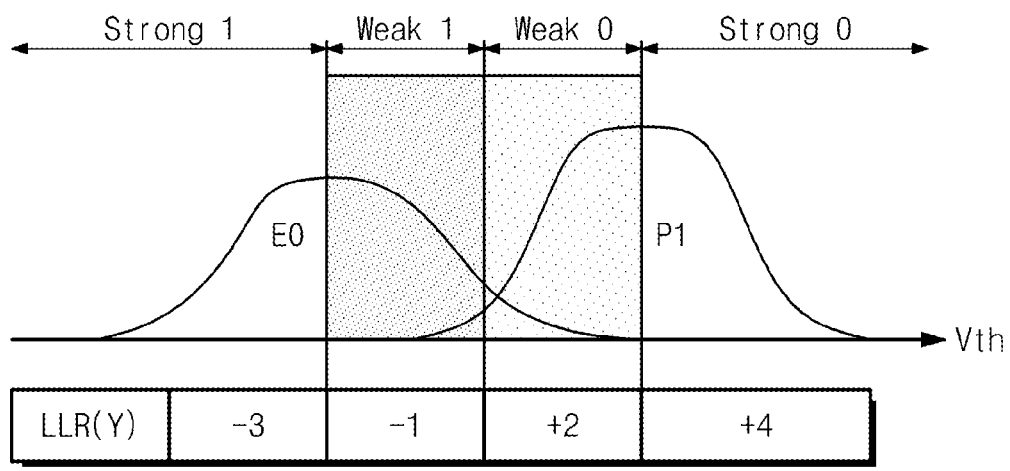
FIG. 11 is a diagram illustrating an example where reliability data corresponding to an erase state cell is used to read MSB data.

FIG. 11 is a diagram illustrating an example where reliability data corresponding to an erase state cell is used to read MSB data. In FIG. 11, a table indicates an LLR for groups of memory cells divided on the basis of threshold voltages.

Referring to FIG. 11, a threshold voltage distribution of erase state cells is spread to overlap with a first program state P1. The reliability of data read from the erase state cells may be corrected according to spreading of the threshold voltage distribution. For example, an LLR value on a group including the erase state cells may be corrected to become closer to '0'. In a secondary error correction operation, a memory system according to certain embodiments of the inventive concept may reduce errors generated due to a variation in threshold voltages of erase state cells by correcting LLR values on MSBs read from the erase state cells.

Figure 12:
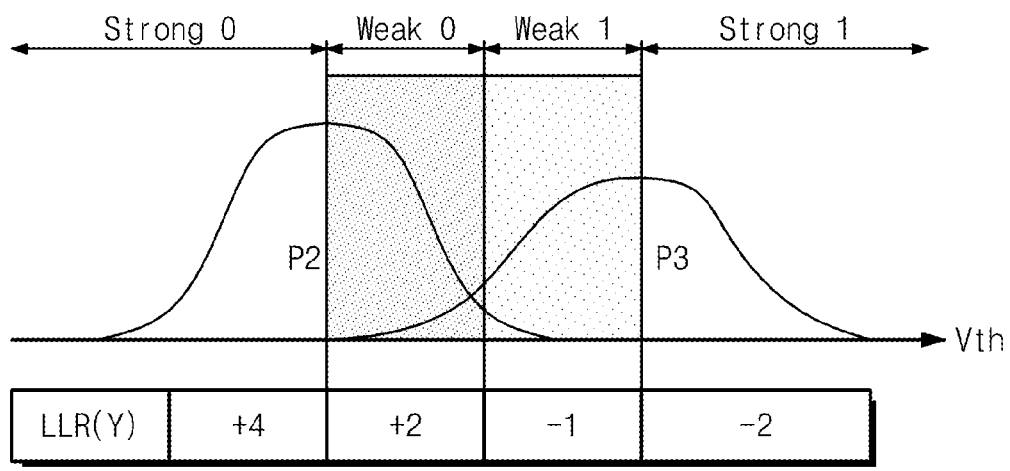
FIG. 12 is a diagram illustrating an example where reliability data corresponding to an uppermost state cell is used to read MSB data.

FIG. 12 is a diagram illustrating an example where reliability data corresponding to an uppermost state cell is used to read MSB data. In FIG. 12, a table may indicate an LLR to groups of memory cells divided on the basis of threshold voltages.

Referring to FIG. 12, a threshold voltage distribution of uppermost state cells is spread to overlap with that of second program state P2. The reliability of data read from the uppermost state cells may be corrected according to spreading of the threshold voltage distribution. For example, an LLR value on a group including the uppermost state cells may be corrected to become more approximate to '0'.

In a secondary error correction operation, a memory system may reduce errors generated due to a variation in threshold voltages of uppermost state cells by correcting LLR values on MSBs read from the uppermost state cells. Although the embodiment of FIG. 12 uses MSBs stored at multi-level cells each storing 2-bit data, the inventive concept is not limited thereto. For example, certain embodiments can perform comparable methods for multi-level cells storing three or more bits of data.

Figure 13:
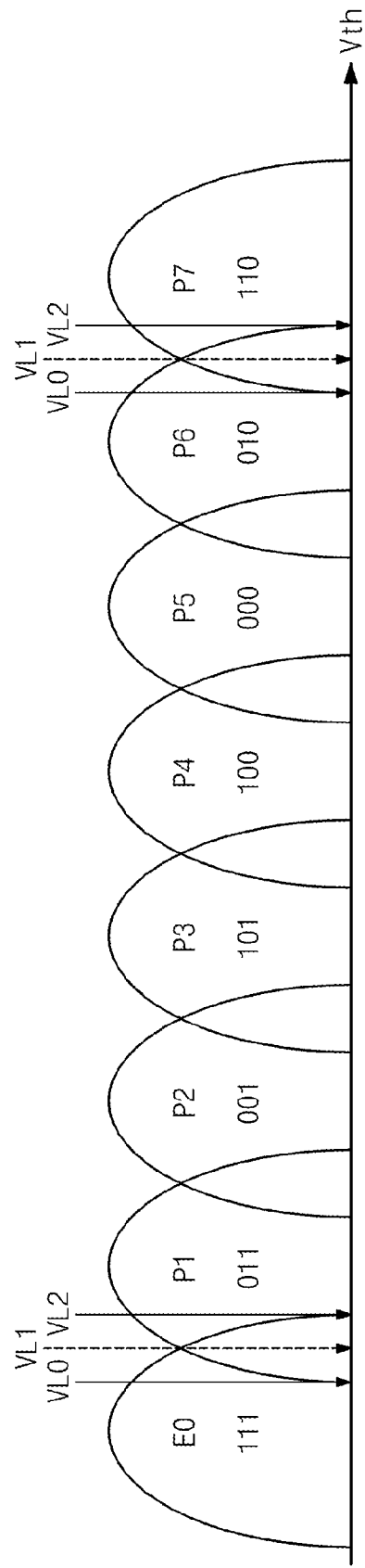
FIG. 13 is a diagram illustrating a soft decision read operation according to another embodiment of the inventive concept.

FIG. 13 is a diagram illustrating a soft decision read operation according to another embodiment of the inventive concept. In the embodiment of FIG. 13, each memory cell stores 3-bit data.

Referring to FIG. 13, in a soft decision read operation, MSB data programmed in memory cells is read. In the soft decision read operation, a primary error correction operation is performed with respect to read MSB data and reliability bits. Where the primary decoding operation is failed, a secondary decoding operation is performed using secondary data.

In some embodiments, secondary data may be data read using left read voltage VL1 (hereinafter, "first secondary data"). Alternatively, secondary data may be data read using right read voltage VR1 (hereinafter, "second secondary data").

In the first secondary data, a bit having a logical value of '1' may be a bit read from an erase state cell, from among MSBs each having a logical value of '1'. In the second secondary data, a bit having a logical value of '0' may be a bit, read from an erase state cell, from among MSBs each having a logical value of '1'.

In a secondary error correction operation, the soft decision read operation may reduce errors generated due to a variation in threshold voltages of erase state cells or uppermost state cells by correcting LLR values on MSBs read from the erase state cells or the uppermost state cells.

Figure 14:
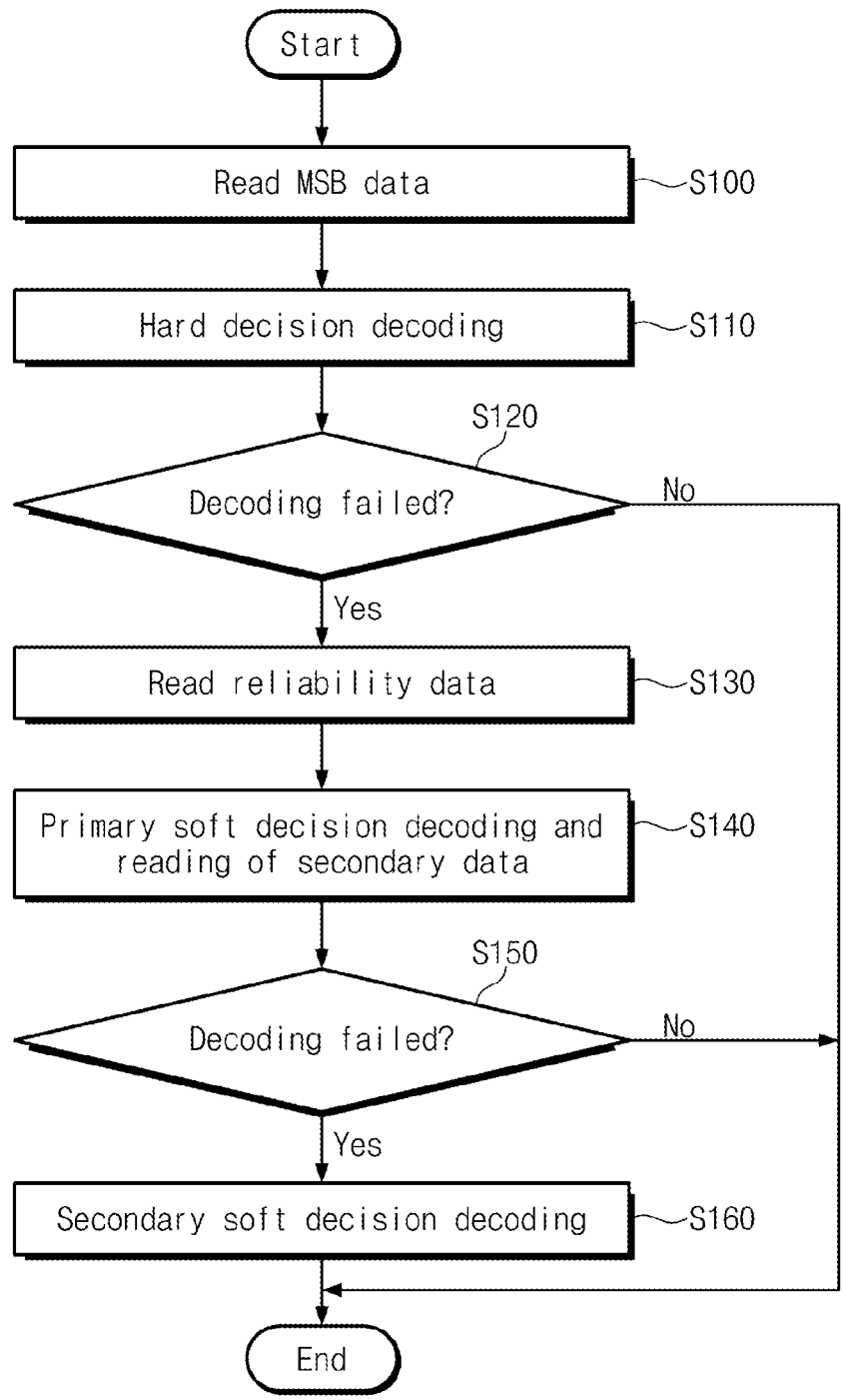
FIG. 14 is a flowchart illustrating a data processing method according to an embodiment of the inventive concept.

FIG. 14 is a flowchart illustrating a data processing method according to an embodiment of the inventive concept. The data processing method of FIG. 14 corrects an error due to a variation in threshold voltages of erase state cells or uppermost state cells in a read operation.

Referring to FIG. 14, in operation S100, MSB data is read to perform a hard decision decoding operation. In operation S110, the hard decision decoding operation is performed with respect to the read MSB data. In operation S120, whether the hard decision decoding operation is passed is determined. If the hard decision decoding operation is determined to be passed, the method ends. If the hard decision decoding operation is determined to be failed, in operation S130, reliability data may be read to perform a soft decision decoding operation.

In operation S140, a primary soft decision decoding operation is performed with respect to the read MSB data based on the read reliability data. At the same time, secondary data for a secondary soft decision decoding operation is read. The secondary data may be formed of bits, read from erase state cells, from among the first transferred MSBs. Alternatively, the secondary data may be formed of bits, read from uppermost state cells, from among the first transferred MSBs. In operation S150, whether the primary soft decision decoding operation is passed may be determined. If the primary soft decision decoding operation is determined to be passed, the method ends. Where the primary soft decision decoding operation is passed, in operation S160, a secondary soft decision decoding operation may be performed with respect to the read MSB data based on the read secondary data. In a secondary error correction operation, the data processing method may reduce errors generated due to a variation in threshold voltages of erase state cells or uppermost state cells by correcting the reliability on MSBs read from the erase state cells or the uppermost state cells.

Figure 15:
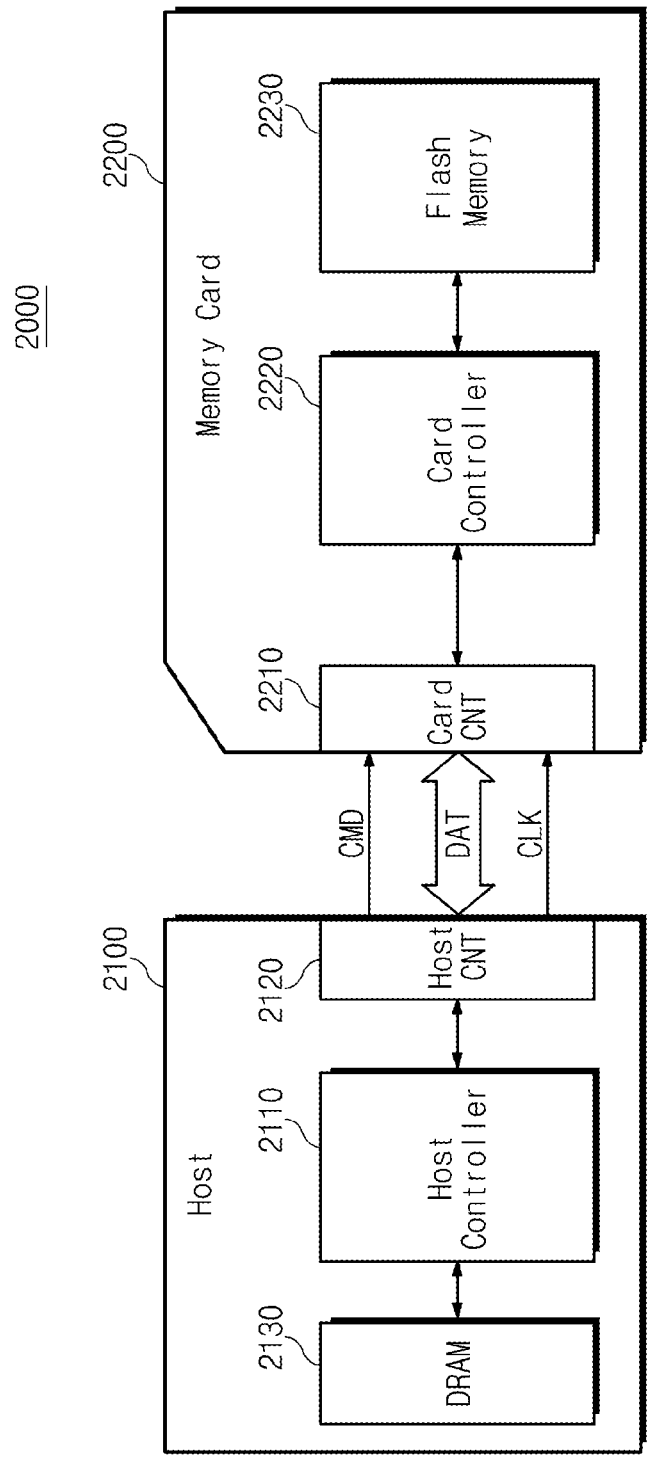
FIG. 15 is a block diagram illustrating a memory card system comprising a memory device according to an embodiment of the inventive concept.

FIG. 15 is a block diagram illustrating a memory card system 2000 comprising a memory device according to an embodiment of the inventive concept.

Referring to FIG. 15, memory card system 2000 comprises a host 2100 and a memory card 2200. Host 2100 comprises a host controller 2110, a host connection unit 2120, and a DRAM 2130.

Host 2100 writes data in memory card 2200 and read data from memory card 2200. Host controller 2110 sends a command (e.g., a write command), a clock signal CLK generated from a clock generator (not shown) in host 2100, and data to memory card 2200 via host connection unit 2120. DRAM 2130 may be a main memory of host 2100.

Memory card 2200 may include a card connection unit 2210, a card controller 2220, and a flash memory 2230. Card controller 2220 stores data in flash memory 2230 in response to a command input via card connection unit 2210. The data is stored in synchronization with a clock signal generated from a clock generator (not shown) in card controller 2220. Flash memory 2230 stores data transferred from host 2100. For example, where host 2100 is a digital camera, memory card 2200 may store image data.

Memory card system 2000 corrects an error generated due to a variation in threshold voltages of erase state cells or uppermost state cells when data is read from flash memory 2230. Thus, the reliability of read data may be improved.

Figure 16:
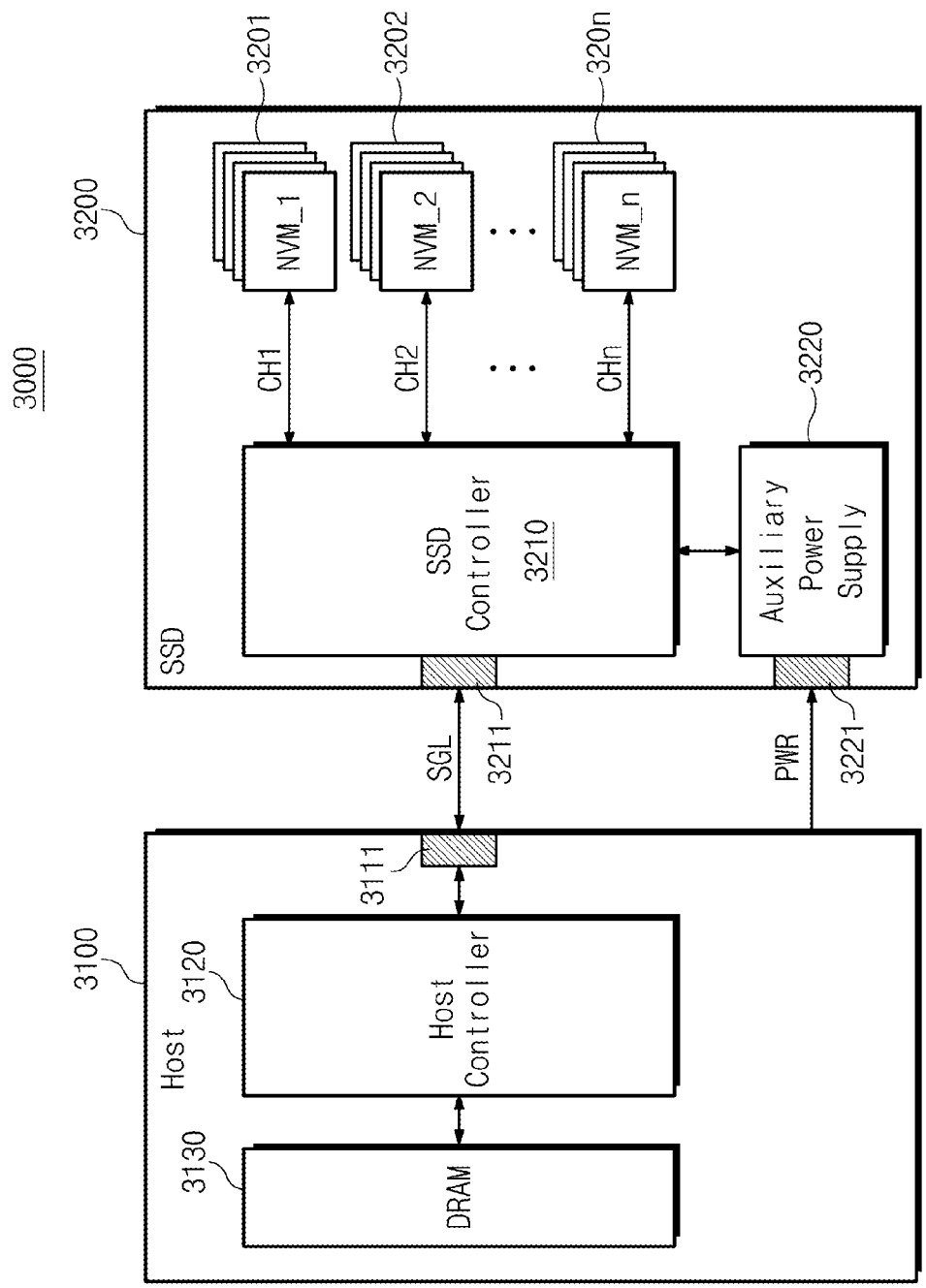
FIG. 16 is a block diagram illustrating a solid state drive (SSD) system comprising a memory device according to an embodiment of the inventive concept.

FIG. 16 is a block diagram illustrating an SSD system 3000 comprising a memory device according to an embodiment of the inventive concept.

Referring to FIG. 16, SSD system 3000 comprises a host 3100 and an SSD 3200. Host 3100 comprises a host interface 3111, a host controller 3120, and a DRAM 3130.

Host 3100 may write data in SSD 3200 or read data from SSD 3100. Host controller 3120 may transfer signals SGL such as a command, an address, a control signal, and the like to SSD 4200 via host interface 3111. DRAM 3130 may be a main memory of host 3100.

SSD 3200 exchanges signals SGL with host 3100 via host interface 3211, and is supplied with a power via a power connector 3221. SSD 3200 may include a plurality of nonvolatile memories 3201 to 320n, an SSD controller 3210, and an auxiliary power supply 3220. Herein, nonvolatile memories 3201 to 320n may be implemented by a NAND flash memory or a nonvolatile memory such as PRAM, MRAM, ReRAM, or the like.

Nonvolatile memories 3201 to 320n may be used as a storage medium of SSD 3200. Nonvolatile memories 3201 to 320n are connected with SSD controller 3210 via a plurality of channels CH1 to CHn. One channel may be connected with one or more nonvolatile memories. Nonvolatile memories connected with one channel may be connected with the same data bus.

SSD controller 3210 exchanges signals SGL with host 3100 via host interface 3211. Signals SGL may include a command, an address, data, and the like. SSD controller 3210 may be configured to write or read out data to or from a corresponding nonvolatile memory according to a command of host 3100. SSD controller 3210 will be more fully described with reference to FIG. 17.

Auxiliary power supply 3220 is connected with host 3100 via power connector 3221. Auxiliary power supply 3220 can be charged by a power PWR from host 3100. Auxiliary power supply 3220 can be placed inside or outside SSD 3200. For example, auxiliary power supply 3220 can be placed on a main board to supply an auxiliary power to SSD 3200.

Figure 17:
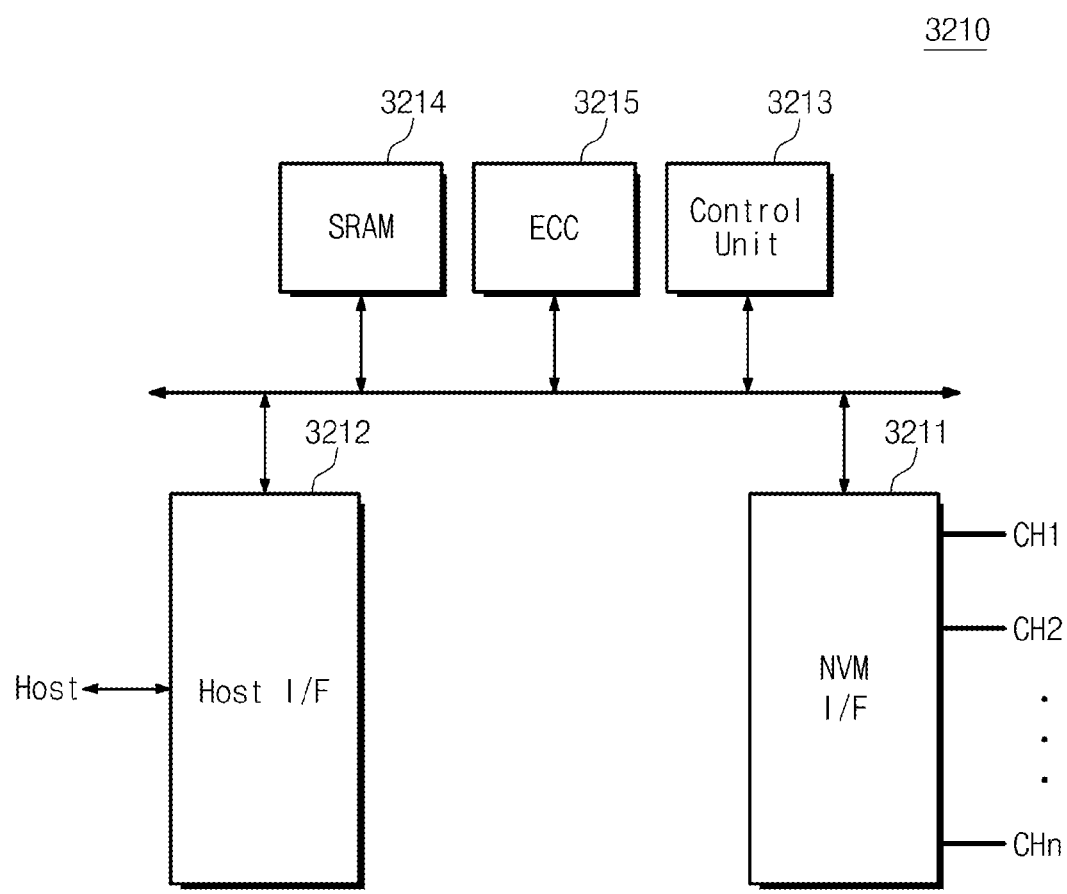
FIG. 17 is a block diagram illustrating an SSD controller in the SSD system of FIG. 16.

FIG. 17 is a block diagram illustrating an example of SSD controller 3210 of FIG. 16.

Referring to FIG. 17, SSD controller 3210 comprises an NVM interface 3211, a host interface 3212, a control unit 3213, an SRAM 3214, and an error correction circuit 3215.

NVM interface 3211 distributes data transferred from a main memory of a host 3100 to channels CH1 to CHn, respectively. NVM interface 3211 transfers data read from nonvolatile memories 3201 to 320n to host 3100 via host interface 3212.

Host interface 3212 provides an interface with an SSD 3200 according to the protocol of host 3100. Host interface 3212 may communicate with host 3100 using Universal Serial Bus (USB), Small Computer System Interface (SCSI), PCI express, ATA, Parallel ATA (PATA), Serial ATA (SATA), Serial Attached SCSI (SAS), or the like. Host interface 3212 may also perform a disk emulation function which enables host 3100 to recognize SSD 3200 as a hard disk drive (HDD).

Control unit 3213 may analyze and process signals input from host 3100. Control unit 3213 controls host 3100 or nonvolatile memories 3201 to 320n through host interface 3212 or NVM interface 3211. Control unit 3213 may control nonvolatile memories 3201 to 320n according to firmware to drive SSD 3200.

SRAM 3124 may be used to drive software which efficiently manages nonvolatile memories 3201 to 320n. SRAM 3214 may store metadata input from a main memory of host 3100 or cache data. At a sudden power-off operation, metadata or cache data stored in SRAM 3214 may be stored in nonvolatile memories 3201 to 320n using an auxiliary power supply 3220.

Error correction circuit 3215 may correct an error generated due to a variation in threshold voltages of erase state cells or uppermost state cells when data is read from nonvolatile memories 3201 to 320n. Thus, the reliability of read data may be improved.

Referring again to FIG. 16, SSD system 3000 corrects errors generated due to variation in threshold voltages of erase state cells or uppermost state cells when data is read from nonvolatile memories 3201 to 320n. Thus, the reliability of read data may be improved.

In the embodiments of FIGS. 16 and 17, SRAM 3214 can be replaced with a nonvolatile memory. For example, SSD system 3000 may be implemented such that a nonvolatile memory (e.g., a flash memory, a PRAM, an RRAM, an MRAM, etc.) performs a role of SRAM 3214.

Figure 18:
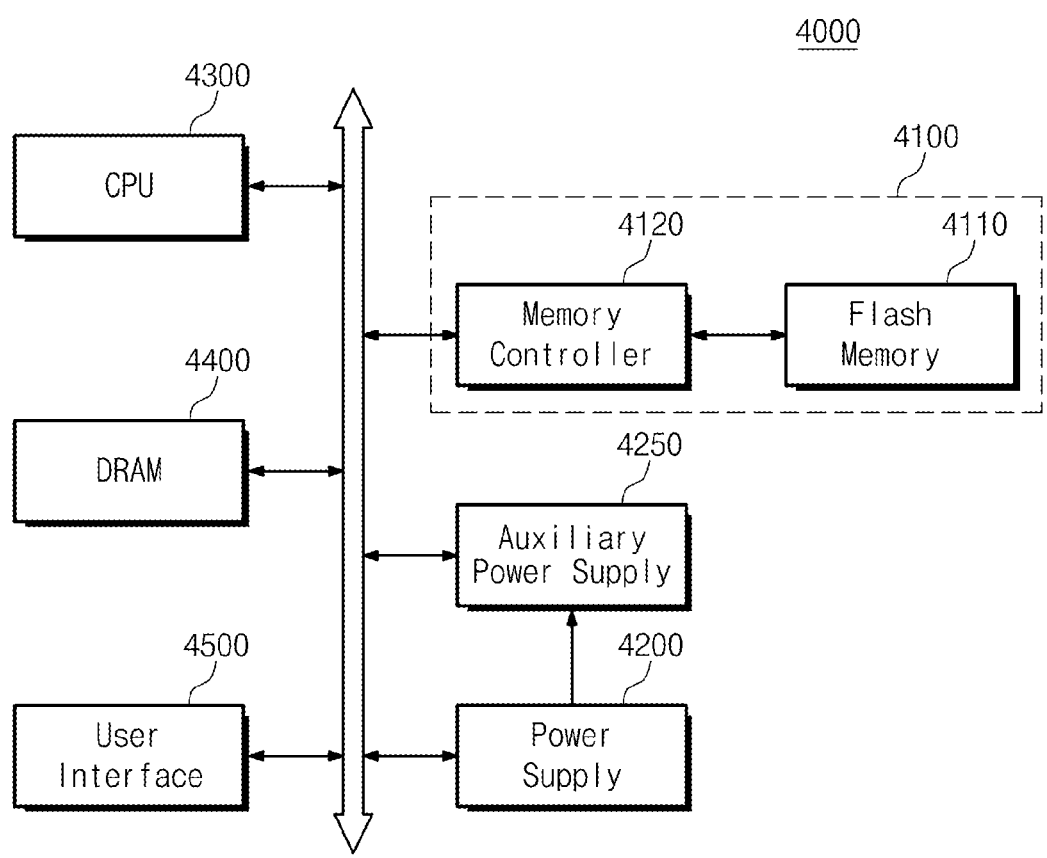
FIG. 18 is a block diagram illustrating an electronic device comprising a memory device according to an embodiment of the inventive concept.

FIG. 18 is a block diagram illustrating an electronic device 4000 comprising a memory device according to an embodiment of the inventive concept. Electronic device 4000 may be, for instance, a personal computer or a handheld electronic device such as a notebook computer, a cellular phone, a PDA, a camera, or the like.

Referring to FIG. 18, electronic device 4000 comprises a memory system 4100, a power supply device 4200, an auxiliary power supply 4250, a CPU 4300, a DRAM 4400, and a user interface 4500. Memory system 4100 may include a flash memory 4110 and a memory controller 4120. Memory system 4100 can be embedded within electronic device 4000.

As indicated by the above description, electronic device 4000 may correct errors generated due to a variation in threshold voltages of erase state cells or uppermost state cells when data is read from flash memory 4110. Thus, the reliability of read data may be improved.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A storage device comprising:
a nonvolatile memory device comprising a plurality of memory cells, wherein the plurality of memory cells are multi-level cells; and
an error correction circuit configured to receive primary data and secondary data from the nonvolatile memory device and to perform a hard decision decoding operation on the primary data and further configured to perform a soft decision decoding operation on the primary data based on the secondary data,
wherein the primary data is read from the plurality of memory cells in a hard decision read operation and the secondary data is read from the plurality of memory cells using a read voltage corresponding to a designated state of the plurality of memory cells, and wherein the secondary data is derived from the primary data in the hard decision read operation.

2. The storage device of claim 1, wherein the designated state is an erase state of the plurality of memory cells.

3. The storage device of claim 2, wherein the primary data is most significant bit (MSB) data read from the plurality of memory cells in the hard decision read operation, and a bit of the secondary data having a logical value of '1' indicates that a corresponding one of the plurality of memory cells has the erase state.

4. The storage device of claim 1, wherein the designated state is a program state of the plurality of memory cells having a highest threshold voltage distribution.

5. The storage device of claim 4, wherein the primary data is most significant bit (MSB) data read from the plurality of memory cells in the hard decision read operation and a bit of the secondary data having a logical value of '0' indicates that a corresponding one of the plurality of memory cells has the program state having the highest threshold voltage.

6. The storage device of claim 1, wherein the error correction circuit performs a primary soft decision decoding operation using the primary data before the soft decision decoding operation is performed.

7. The storage device of claim 1, wherein in the soft decision decoding operation, the error correction circuit adjusts the reliability of data read from memory cells programmed to the designated state based on the secondary data.

8. The storage device of claim 7, wherein the reliability is defined in relation to a log likelihood ratio (LLR).

9. The storage device of claim 8, wherein in the soft decision decoding operation, the error correction circuit corrects an absolute value of log likelihood of data, read from memory cells programmed to the designated state, from among the primary data according to the secondary data to be smaller than that of data read from memory cells programmed to another state.

10. A method of processing data read from a nonvolatile memory device comprising a plurality of memory cells that are multi-level cells, the method comprising:
receiving primary data from the nonvolatile memory device;
performing a hard decision decoding operation on the primary data;
receiving secondary data from the nonvolatile memory device; and
performing a soft decision decoding operation on the primary data based on the secondary data,
wherein the primary data is data read from the plurality of memory cells in a hard decision read operation and the secondary data is read from the plurality of memory cells using a read voltage corresponding to a designated state of the plurality of memory cells, and wherein the secondary data is derived from the primary data in the hard decision read operation.

11. The method of claim 10, wherein the designated state is an erase state of the plurality of memory cells or a program state of the plurality of memory cells having a highest threshold voltage.

12. The method of claim 10, wherein performing the soft decision decoding operation on the primary data based on the secondary data comprises adjusting the reliability of data read from the plurality of memory cells programmed to the designated state among the primary data based on the secondary data.

13. The method of claim 10, further comprising performing a primary soft decision decoding operation using the primary data prior to the soft decision decoding operation.

14. The method of claim 13, further comprising performing the hard decision decoding operation using the primary data prior to the primary soft decision decoding operation.

15. The method of claim 13, wherein performing the primary soft decision decoding operation and receiving secondary data from the nonvolatile memory device are performed concurrently.

16. The method of claim 14, wherein the primary soft decision decoding operation is performed as a consequence of determining that the hard decision decoding operation has failed.

17. The method of claim 13, wherein the soft decision decoding operation is performed as a consequence of determining that the primary soft decision decoding operation has failed.

18. A method of reading a nonvolatile memory device, comprising:

reading primary data from a plurality of multi level cells (MLCs) in the nonvolatile memory device;

performing a hard decision decoding operation on the primary data;

determining whether the hard decision decoding operation has failed;

upon determining that the hard decision decoding operation has failed, reading secondary data from the plurality of MLCs; and performing a soft decision decoding operation based on the primary data and the secondary data, wherein the primary data is read from the plurality of MLCs in a hard decision read operation and the secondary data is read from the plurality of MLCs using a read voltage corresponding to a designated state of the plurality of MLCs, and wherein the secondary data is derived from the primary data in the hard decision read operation.

19. The method of claim 18, further comprising determining whether the soft decision decoding operation has failed, and upon determining that the soft decision decoding operation has failed, performing a secondary soft decision decoding operation.

20. The method of claim 18, wherein the soft decision decoding operation is performed in consideration of reliability data of the primary data.

* * * * *